(12) United States Patent
Chen et al.

(10) Patent No.: US 9,041,163 B2
(45) Date of Patent: May 26, 2015

(54) SEMICONDUCTOR STRUCTURE AND MANUFACTURING METHOD THEREOF

(71) Applicant: Industrial Technology Research Institute, Hsinchu (TW)

(72) Inventors: Shang-Chun Chen, Hsinchu County (TW); Cha-Hsin Lin, Miaoli County (TW); Yu-Chen Hsin, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 40 days.

(21) Appl. No.: 14/033,524

(22) Filed: Sep. 23, 2013

(65) Prior Publication Data

US 2014/0312468 A1   Oct. 23, 2014

(30) Foreign Application Priority Data

Apr. 17, 2013   (TW) .............................. 102113615 A

(51) Int. Cl.
*H01L 21/768* (2006.01)
*H01L 23/48* (2006.01)

(52) U.S. Cl.
CPC ........ *H01L 21/76898* (2013.01); *H01L 23/481* (2013.01); *H01L 2224/13* (2013.01); *H01L 2924/0002* (2013.01)

(58) Field of Classification Search
CPC ................................................ H01L 21/76898
USPC ......................................... 257/621; 438/667
See application file for complete search history.

(56) References Cited

U.S. PATENT DOCUMENTS 8,049,327 B2   11/2011   Kuo et al.
(Continued)

FOREIGN PATENT DOCUMENTS

TW   201027703   7/2010
TW   201240040   10/2012

OTHER PUBLICATIONS

Henry, D. et al., "Wafer Level Packaging Technology Development for CMOS Image Sensors Using Through Silicon Vias," 2nd Electronics System-Integration Technology Conference, Sep. 1-4, 2008, pp. 141-148.
Makoto Motoyoshi, "Through-Silicon Via (TSV)," Proceeding of the IEEE, vol. 97, No. 1, Jan. 2009, pp. 43-48.
(Continued)

*Primary Examiner* — Daniel Shook
(74) *Attorney, Agent, or Firm* — Jianq Chyun IP Office

(57) ABSTRACT

A semiconductor structure and a manufacturing method thereof are provided. The semiconductor structure includes a substrate, a device layer and a least one conductive post. The substrate includes a first surface, a second surface opposite to the first surface, and at least one through hole penetrating the substrate. The substrate includes a first side wall portion and a second side wall portion at the through hole. The first side wall portion is connected to the first surface and includes a plurality of first scallops. The second side wall portion is connected to the second surface and includes a non-scalloped surface. The device layer is disposed on the second surface, and the second side wall portion of the substrate further extends into the device layer along the non-scalloped surface. The conductive post is disposed in the through hole, wherein the conductive post is electrically connected to the device layer.

25 Claims, 14 Drawing Sheets

(56) References Cited

U.S. PATENT DOCUMENTS

| | | |
|---|---|---|
| 8,062,975 B2 | 11/2011 | Sanders et al. |
| 8,202,797 B2 | 6/2012 | Chi et al. |
| 8,232,626 B2 | 7/2012 | Tsui et al. |
| 8,278,152 B2 | 10/2012 | Liu et al. |
| 2007/0190743 A1 | 8/2007 | Colombo |
| 2008/0272466 A1 | 11/2008 | Lake |
| 2011/0207323 A1 | 8/2011 | Ditizio |
| 2012/0023225 A1 | 1/2012 | Imes et al. |
| 2012/0061827 A1* | 3/2012 | Fujita ............................ 257/737 |
| 2012/0119374 A1 | 5/2012 | Rahman et al. |
| 2012/0270404 A1 | 10/2012 | Bajaj et al. |

OTHER PUBLICATIONS

Pham, N.P. et al, "Zero-level Packaging for (RF-)MEMS Implementing TSVs and Metal Bonding," 61st Electronic Components and Technology Conference, May 31, 2011-Jun. 3, 2011, pp. 1588-1595.

Matthias, T. et al., "CMOS Image Sensor Wafer-level Packaging," 12th International Conference on Electronic Packaging Technology and High Density Packaging (ICEPT-HDP), Aug. 8-11, 2011, pp. 1-6.

Kaiho, Y. et al., "3D Integration Technology for 3D Stacked Retinal Chip," IEEE International Conference on 3D System Integration, Sep. 28-30, 2009, pp. 1-4.

"Notice of Allowance of Taiwan Counterpart Application," issued on Mar. 16, 2015, p1-p4, in which the listed references were cited.

* cited by examiner

SEMICONDUCTOR STRUCTURE AND MANUFACTURING METHOD THEREOF

CROSS-REFERENCE TO RELATED APPLICATION

This application claims the priority benefit of Taiwan application serial no. 102113615, filed on Apr. 17, 2013. The entirety of the above-mentioned patent application is hereby incorporated by reference herein and made a part of this specification.

TECHNICAL FIELD

The technical field relates to a semiconductor structure and a manufacturing method thereof.

BACKGROUND

In the field of semiconductor packaging, a through silicon via (TSV) is mainly used for allowing wires on the top surface and the bottom surface to be electrically connected to each other. Distinguished from the conventional semiconductor packaging, through the disposition of the TSV, a plurality of chips within a semiconductor packaging may provide an enhancement of the packaging density of the semiconductor packaging structure, a reduction of the size of the semiconductor packaging structure, an increment of the speed of the device, a reduction of signal delay and power consumption. Accordingly, the development of the TSV technology is advantageous for electronic product miniaturization due to the semiconductor packaging industrial attention to the TSV.

In present, the manufacturing process of the TSV is normally performed after the manufacture of a semiconductor device layer in the semiconductor manufacturing process. In general, a through hole is required to be formed on a wafer during the manufacture of the TSV. For example, the required through hole for forming the TSV may be achieved by an etching process on the back side of the wafer until the formed through hole exposes a complementary metal-oxide semiconductor. Alternatively, the through hole may be formed by an etching process on the front side of the wafer until the through hole extends to the back side of the wafer. The technique of etching the wafer from the front side may possibly damage a metal-oxide semiconductor while the technique of etching the wafer from the back side may prevent an adverse impact on the complementary metal-oxide semiconductor. Therefore, the technique of etching the wafer from the back side to form the through hole grows and becomes mainstream. Nonetheless, due to a higher aspect ratio of the through hole penetrating the wafer, when to stop the etching procedure is difficult to be determined. Hence, the researchers may encounter difficulties in controlling the etching depth of the through hole so that the wafer may not be completely etched or may be over-etched at which the through hole is located. When the through hole is not etched completely, the wires in the complementary metal-oxide semiconductor layer may not be exposed by the through hole and may not be connected to a conductor in the through hole. Thus, an open circuit occurs between the wires and the conductor in the through hole. When the over-etching occurs, notches may be formed at the interface between the substrate and the complementary metal-oxide semiconductor device layer in the wafer, the notches may lead to difficulties in the deposition of an insulting liner layer. For example, the deposition thickness of the insulting liner layer on the notches may be insufficient or the insulting liner layer may be non-continuous on the notches, and therefore the notches may result in electrical leakages. The reliability and the manufacturing yield of the semiconductor structure may be adversely affected.

In view of the foregoing, to properly control the process recipe of a conductive through via to prevent the aforementioned notches during the manufacturing process becomes an important issue.

SUMMARY

In one of exemplary embodiments, a semiconductor structure including a substrate, a device layer, and at least one conductive post is provided. The substrate includes a first surface, a second surface opposite to the first surface, and at least one through hole penetrating the substrate. The substrate includes a first side wall portion and a second side wall portion at the through hole. The first side wall portion is connected to the first surface of the substrate and includes a plurality of first scallops. The first scallops are regularly distributed on a surface of the first side wall portion. The second side wall portion is connected to the second surface of the substrate and includes a non-scalloped surface. An included angle is formed between the non-scalloped surface and the second surface. The device layer is disposed on the second surface of the substrate, and the second side wall portion of the substrate further extends into the device layer along the non-scalloped surface. The conductive post is disposed in the through hole, and the conductive post and the device layer are electrically connected.

In one of exemplary embodiments, a semiconductor structure including a substrate, a device layer, and at least one conductive post is included. The substrate includes a first surface, a second surface opposite to the first surface, and at least one through hole penetrating the substrate. The substrate includes a first side wall portion and a second side wall portion at the through hole. The first side wall portion is connected to the first surface of the substrate and includes a plurality of first scallops. The first scallops are regularly distributed on a surface of the first side wall portion. The second side wall portion is connected to the second surface of the substrate and includes a plurality of second scallops. The second scallops are regularly distributed on a surface of the second side wall surface. The dimensions of the first scallops are less than the dimensions of the second scallops. The device layer is disposed on the second surface of the substrate. The second side wall portion of the through hole is disposed between the first side wall portion and the device layer, and the second side wall portion of the through hole further extends into the device layer. The conductive post is disposed in the through hole, and the conductive post and the device layer are electrically connected.

In one of exemplary embodiments, a manufacturing method of a semiconductor structure includes the following steps. A substrate is provided, wherein the substrate includes a first surface and a second surface opposite to each other. Next, a device layer is formed on the second surface of the substrate. Then, a portion of the substrate is removed from the first surface so as to form at least one through hole in the substrate. The method for forming the through hole includes the following steps. A first side wall portion is formed in the substrate under a first etching condition. The first side wall portion is connected to the first surface of the substrate and includes a plurality of first scallops. The first side wall portion does not expose the device layer. Then, a second side wall portion is formed in the substrate under a second etching condition. The second side wall portion is connected to the second surface of the substrate. The first side wall portion and the second side wall portion form the through hole, and the second side wall portion includes a non-scalloped surface. An included angle is formed between the non-scalloped surface and the second surface. Then, a conductive post is formed in the through hole, wherein the conductive post and the device layer are electrically connected.

In one of exemplary embodiments, a manufacturing method for a semiconductor structure includes a substrate, wherein the substrate includes a first surface and a second surface opposite to each other. Next, a device layer is formed on the second surface of the substrate. Then, a portion of the substrate is removed from the first surface so as to form at least one through hole in the substrate. The method for forming the through hole includes the following steps. A first side wall portion is formed in the substrate under a first etching condition. The first side wall portion is connected to the first surface of the substrate and includes a plurality of first scallops. The first side wall portion does not expose the device layer. Next, a second side wall portion is formed in the substrate under a second etching condition. The second side wall portion is connected to the second surface of the substrate. The first side wall portion and the second side wall portion form the through hole, and the second side wall portion includes a plurality of second scallops. The dimensions of the first scallops are less than the dimensions of the second scallops. Then, a conductive post is formed in the through hole, and the conductive post and the device layer are electrically connected.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1-FIG. 4, FIG. 5A, FIG. 6A, FIG. 7A, and FIG. 8-FIG. 12A (or FIG. 12B) are schematic flow diagrams of a manufacturing method of a semiconductor according to the first embodiment of the disclosure.

FIG. 5A is a cross-sectional schematic diagram of a first side wall portion according to the first embodiment of the disclosure.

FIG. 6A is a cross-sectional diagram of a through hole according to the first embodiment of the disclosure.

FIG. 7A is a cross-sectional diagram of another through hole according to the first embodiment of the disclosure.

FIG. 12A and FIG. 12B are cross-sectional diagrams of different semiconductor structure according to the first embodiment of the disclosure.

DETAILED DESCRIPTION OF DISCLOSED EMBODIMENTS

The First Embodiment

Figure 1:
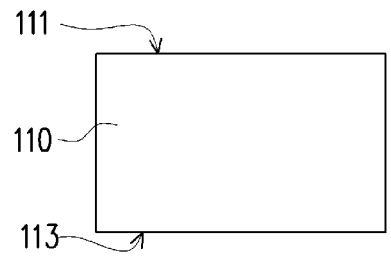

FIG. 1-FIG. 4, FIG. 5A, FIG. 6A, FIG. 7A, and FIG. 8-FIG. 12A (or FIG. 12B) are schematic flow diagrams of a manufacturing method of a semiconductor according to the first embodiment of the disclosure. Referring to FIG. 1, a substrate 110 is first provided, wherein the substrate 110 includes a first surface 111 and a second surface 113 opposite to each other. In the present embodiment, the substrate 110 may be a silicon (Si) substrate, and yet the disclosure is not limited thereto. In other embodiments, the substrate 110 may also be a glass substrate, an aluminum oxide substrate, a silicon carbide (SiC) substrate, a III-V group semiconductor substrate, or other substrates suitable for manufacturing a semiconductor structure.

Figure 2:
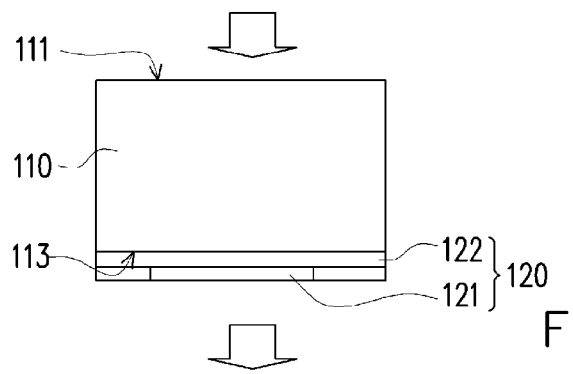

Next, referring to FIG. 2, an device layer 120 is formed on the second surface 113 of the substrate 110, wherein the device layer 120 includes a conductor layer 121 and a first dielectric layer 122 disposed between the conductor layer 121 and the substrate 110. In the present embodiment, the material of the conductor layer 121 may be metal, alloy, metal silicide, or other suitable conductive materials. Moreover, in other embodiments, the conductor layer 121 may also be a doped conductor layer.

Figure 3:
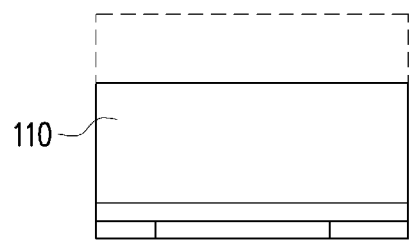
Figure 4:
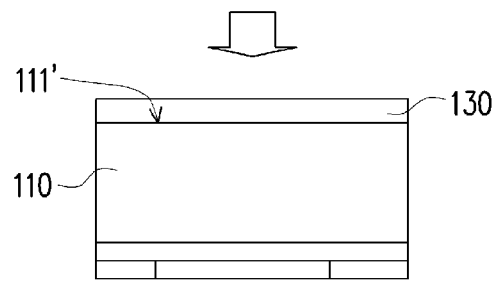

Continuing referring to FIG. 3 and FIG. 4, after the device layer 120 is formed, the substrate 110 may be selectively thinned according to actual requirements. In the present embodiment, the method for thinning the substrate 110 may be done by, for example, a wafer backside grinding process, and yet the disclosure is not limited thereto. Next, as illustrated in FIG. 4, a second dielectric layer 130 may be formed on the new first surface 111' of the thinned substrate 110, and yet the disclosure is not limited thereto. In other embodiments, the step in FIG. 4 may be omitted; that is, the second dielectric layer 130 is not formed on the substrate 110.

Next, a portion of the substrate 110 is removed from the first surface 111' to form at least one through hole (not shown)

in the substrate 110. In the present embodiment, before an etching process is performed on the substrate 110, a patterned photo-resist layer may be formed on the substrate 110 through a photolithography process to define the position of the through hole. Then, the substrate 110 is partially removed by the patterned photo-resister layer used as a mask. The approach to partially remove the substrate 110 may be, for example, an etching process. The method for forming the through hole is described with further detail along with FIG. 5A-FIG. 7B hereafter.

Figure 5A:
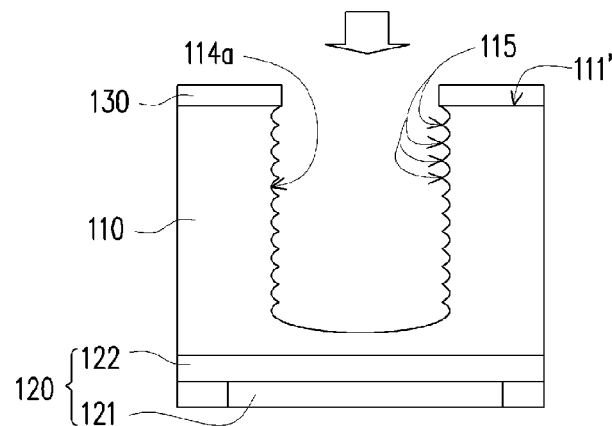
Figure 5B:
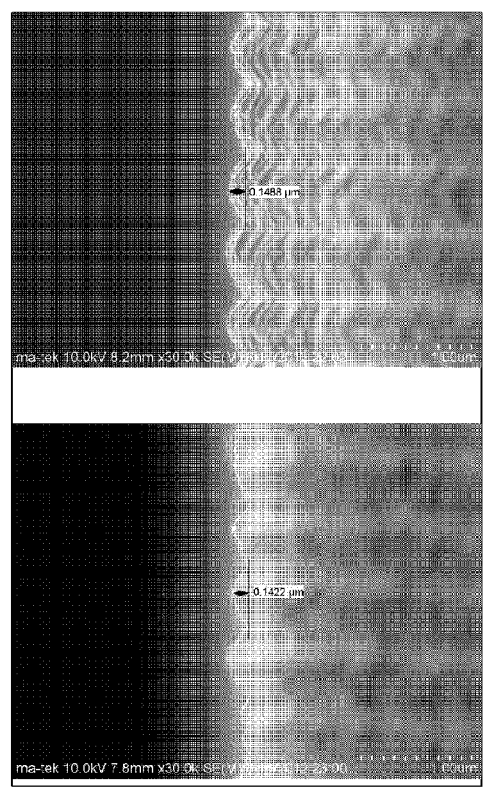
FIG. 5B is a scanning electron microscope image of a local area in FIG. 5A.

FIG. 5A is a cross-sectional schematic diagram of a first side wall portion according to the first embodiment of the disclosure. FIG. 5B is a scanning electron microscope image of a local area in FIG. 5A. Referring to FIG. 5A, a first side wall portion 114a is formed in the substrate 110 under a first etching condition, and the first side wall portion 114a is connected to the first surface 111' of the substrate 110. In the present embodiment, the first etching condition is a Bosch Deep Reactive Ion Etching (Bosch DRIE) process. In general, the Bosch DRIE process includes a plasma etching step with sulphur hexafluoride ($SF_6$) and a passivation step with high-molecular gas, wherein the above-mentioned two steps are performed alternately and continuously to form the first side wall portion 114a in the substrate 110. To be more specific, the passivation step means that the high-molecular gas may form a polymer layer (or a passivation layer) on the first side wall portion 114a on the substrate 110 during the plasma etching step to protect the first side wall portion 114a. In the present embodiment, the high-molecular gas may be octafluorocyclobutane ($C_4F_8$), and yet the disclosure is not limited thereto. In other embodiments, the high-molecular gas may also be octafluoropropane ($C_3F_8$), perfluoro-compound gas with a high carbon/fluorine (C/F) ratio, or other gas suitable for forming the polymer layer (or the passivation layer).

As illustrated in FIG. 5A and FIG. 5B, since the etching step and the passivation step are performed alternately in the Bosch DRIE process, a plurality of first scallops 115 may be formed on the first side wall portion 114a. Moreover, no matter the dimension of the first scallops 115 is large (as illustrated on the top of FIG. 5B) or small (as illustrated at the bottom of FIG. 5B), the first scallops 115 may appear in regular patterns. Next, the substrate 110 is being etched until approaching to the first dielectric layer 122. Meanwhile, the first side wall portion 114a has not yet exposed the device layer 120.

Figure 6A:
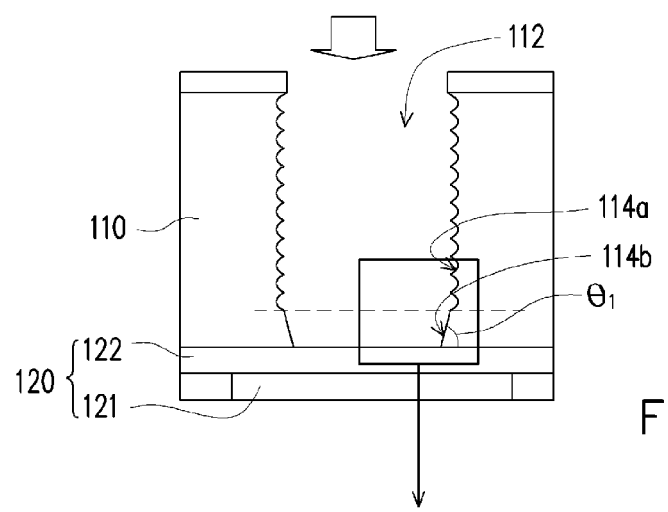
Figure 6B:
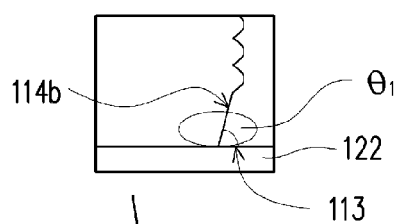
FIG. 6B is an enlarged partial diagram of a side wall of the through hole in FIG. 6A.
Figure 6C:
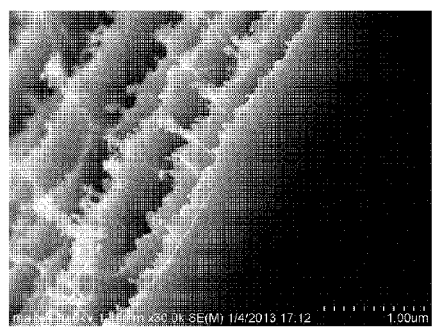
FIG. 6C is a scanning electron microscope image of a local area in FIG. 6B.

FIG. 6A is a cross-sectional diagram of a through hole according to the first embodiment of the disclosure. FIG. 6B is an enlarged partial diagram of a side wall of the through hole in FIG. 6A. FIG. 6C is a scanning electron microscope image of a local area in FIG. 6B. Referring to FIG. 6A, a second side wall portion 114b is formed in the substrate 110 under a second etching condition. In the present embodiment, the method for forming the second etching condition includes adjusting etching parameters of the first etching condition followed by forming the second side wall portion 114b by a non-Bosch DRIE process. To be more specific, as illustrated in FIG. 6B, adjusting the etching parameters of the first etching condition may allow an inclination angle on the first side wall portion 114a so that an included angle $\theta_1$ is formed between the second side wall portion 114b and the second surface 113 during the follow-up non-Bosch DRIE process. Moreover, the non-Bosch DRIE process may be, for example, performing the etching process through an ion bombardment treatment in the present embodiment. Accordingly, as illustrated in FIG. 6C, an irregularly rough surface may appear on the second side wall portion 114b without a plurality of scallops distributed regularly. In other words, the second side wall portion 114b is a non-scalloped surface in the present embodiment.

Revisiting FIG. 6A, the etching process is stopped when reaching the first dielectric layer 122. In the meantime, the second side wall portion 114b is connected to the second surface 113 of the substrate 110, and the first side wall portion 114b and the second side wall portion 114b may form a through hole 112 in the substrate. Moreover, in the present embodiment, the included angle $\theta_1$ between the second side wall portion 114b and the second surface 113 may be an acute angle, wherein the included angle $\theta_1$ is between 30 degrees and 80 degrees. It should be noted that, the range of each of the parameters is merely exemplary in nature and is not intended to limit the disclosure. Furthermore, the included angle $\theta_1$ may vary due to some factors such as a process recipe or a design requirement and may be other angles such as a right angle. Further descriptions along with FIG. 7A and FIG. 7B are as follows.

Figure 7A:
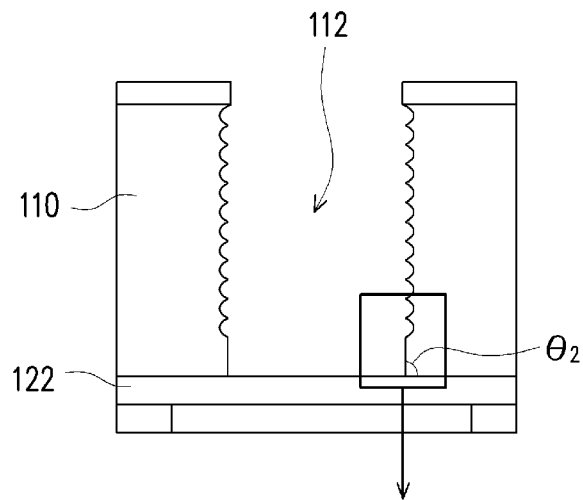
Figure 7B:
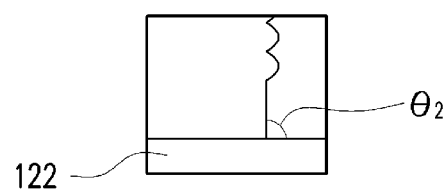
FIG. 7B is an enlarged partial diagram of a side wall of the through hole in FIG. 7A.

FIG. 7A is a cross-sectional diagram of another through hole according to the first embodiment of the disclosure. FIG. 7B is an enlarged partial diagram of a side wall of the through hole in FIG. 7A. Referring to FIG. 7A, within a portion of the substrate 110 with a faster etching rate such as the center of the substrate 110, when the etching process reaches the first dielectric layer 122, the process may not stop immediately but rather control etching parameters and time properly so as to change the outline of the bottom part of the through hole 112. Meanwhile, a side-etching effect is more notable, and an included angle $\theta_2$ may be larger accordingly (approximate to a right angle). In the mean time, as illustrated in FIG. 7B, the included angle $\theta_2$ may be a right angle or slightly smaller than a right angle.

After the through hole 112 in FIG. 6A or FIG. 7A is formed, a conductive post is formed in the through hole 112, wherein the conductive post and the device layer 120 are electrically connected. The method for forming the conductive post is described with further detail along with FIG. 8-FIG. 12A (or FIG. 12B) hereafter. It is noted that, the method for forming the conductive post is illustrated by the through hole 112 in FIG. 6A, and yet the disclosure is not limited thereto. The through hole 112 in FIG. 7A, the second embodiment, the third embodiment, or other embodiments (not shown) may also employ a manufacturing process similar to FIG. 8-FIG. 12A (or FIG. 12B) for manufacturing the conductive post.

Figure 8:
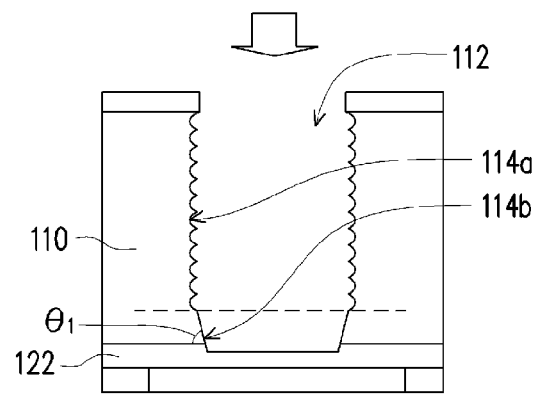

Referring to FIG. 8, after the through hole 112 is formed, a portion of the first dielectric layer 122 may be further removed so as to allow the second side wall portion 114b to extend into the dielectric layer 122 along the non-scalloped surface. In the present embodiment, the method for removing the portion of the first dielectric layer 122 may be, for example, the non-Bosch DRIE process, and yet the disclosure is not limited thereto. In other embodiments, the method for removing the portion of the first dielectric layer 122 may also be a wet etching process.

Figure 9:
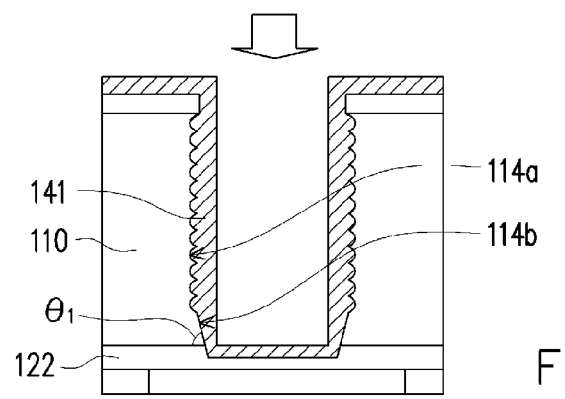

Next, referring to FIG. 9, a liner layer 141 is deposited on the first side wall portion 114a, the second side wall portion 114b, and a portion of the first dielectric layer 122 exposed by the through hole 112. In the present embodiment, the material of the liner layer 141 includes oxides or other suitable insulating materials. Moreover, in the present embodiment, the method for depositing the liner layer 141 includes a chemical vapour deposition (CVD) process. To be more specific, the CVD process includes a thermal CVD process, a plasma enhanced CVD (PE-CVD) process, and a low press CVD (LP-CVD) process. However, in the present embodiment, the method for depositing the liner layer 141 may also be other suitable manufacturing process. The disclosure is not limited herein.

Figure 10:
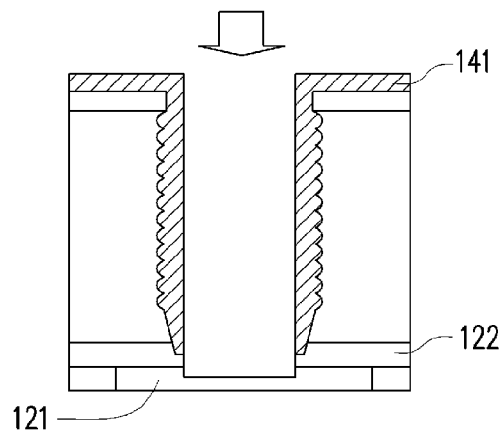

Next, referring to FIG. 10, the liner layer 141 on top of the first dielectric layer 122 and the first dielectric layer 122 are removed so as to expose the conductor layer 121. In the present embodiment, the methods for removing the liner layer 141 and the first dielectric layer 122 are similar to the manufacturing process in FIG. 8 and may not be repeated herein. To be more specific, as illustrated in FIG. 10, during the exposure of the conductor layer 121, a portion of the conductor layer 121 may be removed. For example, the removed portion of the conductor layer may be a silicide layer, and yet the disclosure is not limited thereto. In another embodiment, the conductor layer 121 may include a barrier layer (not shown) and a copper layer (not shown). In such embodiment, while the conductor layer 121 is exposed, the barrier layer may be removed to expose the copper layer. To be more specific, the material of the barrier layer may be tantalum (Ta), tantalum nitride (TaN), titanium (Ti), titanium nitride (TiN), or other suitable materials. Moreover, the copper layer may be substituted by another suitable metal layer. The disclosure is not limited to the copper layer.

Figure 11:
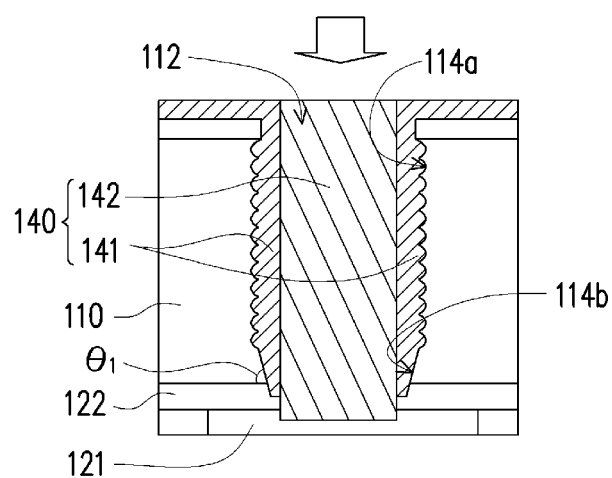

Next, referring to FIG. 11, the through hole 112 is filled up by a conductive material to form a plug 142. In the present embodiment, the conductive material may be copper, tungsten, or other suitable conductive materials. Moreover, in the present embodiment, the method for filling up the through hole 112 by the conductive material includes a physical vapour deposition (PVD) process, a CVD process, and an electroplating plating process or an electroless plating process. To be more specific, the PVD process includes an evaporation process or a sputter deposition process; the CVD process includes a plasma-assisted CVD process; the electroplating process or the electroless plating process is the method for filling up the plug. As illustrated in FIG. 11, the conductive post 140 comprises the liner layer 141 and the plug 142, and the first side wall portion 114a and the second side wall portion 114b are covered by the liner layer 141. Accordingly, the plug 142 and the substrate 110 may be electrically insulated from each other.

Figure 12A:
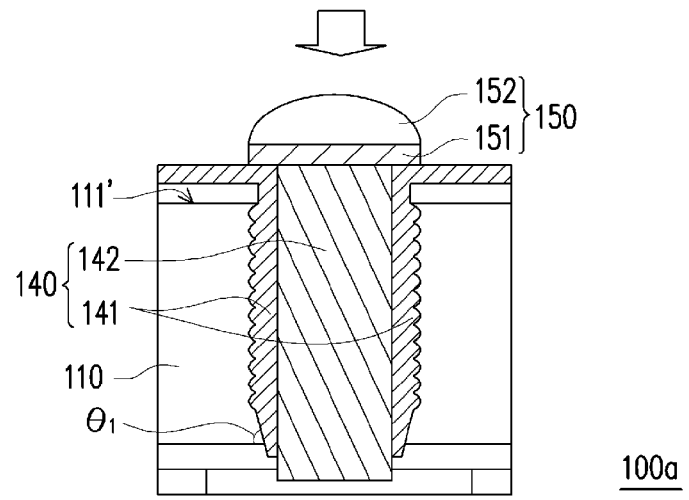
Figure 12B:
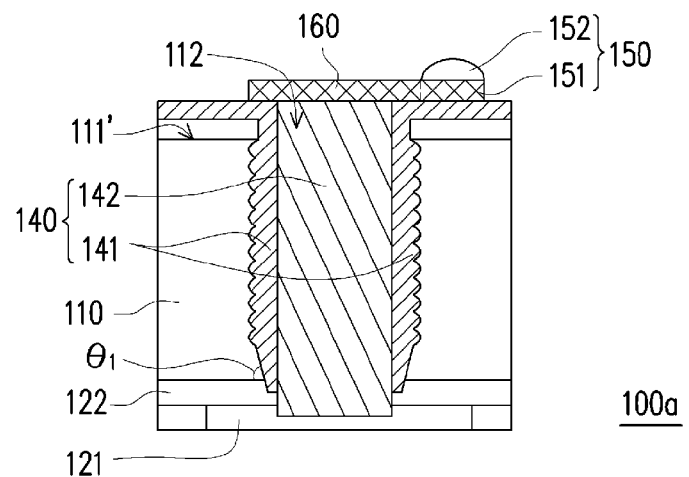
Figure 13:
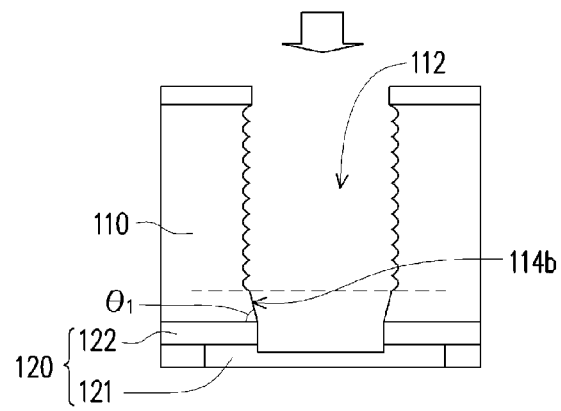
FIG. 13-FIG. 17 are schematic flow diagrams of a manufacturing method for forming a conductive post according to the second embodiment of the disclosure.

FIG. 12A and FIG. 12B are cross-sectional diagrams of different semiconductor structure according to the first embodiment of the disclosure. Referring to FIG. 12A or FIG. 12B, an external terminal 150 is formed on the first surface 111', and a conductive structure 110a of the present embodiment is thus formed. In the present embodiment, the external terminal 150 may include a bonding pad 151 and a bump 152. To be more specific, the bonding pad 151 and the bump 152 may be the same or different conductive materials such as copper, nickel, alloy, or other suitable conductive materials. As illustrated in FIG. 12A, the external terminal 150 of the semiconductor structure 100a is disposed on the first surface 111' and electrically connected to the conductive post 140 to perform a follow-up wafer bonding process. However, it should be noted that the disclosure is not limited thereto. In another embodiment, the manufacturing method for forming the semiconductor structure 100a may further include at least one redistribution layer 160 formed on the first surface 111'. To be more specific, the material of the redistribution layer 160 may be a suitable conductive material such as aluminium, copper, or the alloy thereof. As illustrated in FIG. 12B, the redistribution layer 160 is disposed on the first surface 111', electrically connected to the conductive post 140, and further electrically connected to the external terminal 150 disposed elsewhere according to an actual requirement in the follow-up wafer bonding process. The redistribution layer 160 may re-layout a circuit layer design of the semiconductor structure 100a.

Since different etching conditions may be formed by adjusting the etching parameters or changing the etching process in different etching stages, the two-section structure, the first side wall portion 114a and the second side wall portion 114b, may be formed in the substrate 110. The substrate 110 may be thus prevented from being over-etched or unetched during the formation of the through hole 112. Additionally, the depth of the through hole 112 may be further controlled properly to prevent the formation of notches and may be advantageous for the deposition of the liner layer 141. The liner layer 141 may thus become a continuous insulation layer with a suitable thickness and provide excellent insulation properties to the conductive post 140 and the substrate 110. Therefore, an electrical leakage may be prevented, while the reliability as well as the manufacturing yield of the semiconductor structure 100a may be further enhanced.

It should be noted that, in the disclosure, besides allowing the second side wall portion 114b to extend into the first dielectric layer 122 along the non-scalloped surface, the method for forming the conductive post may also allow the second side wall portion 114b to extend into the conductor layer 121. Further descriptions along with FIG. 13-FIG. 17 are as follows. It should be noted that, the method for forming the conductive post 140 is illustrated by the through hole 112 in FIG. 6A, and yet the disclosure is not limited thereto. The through hole 112 in FIG. 7A, the third embodiment, the fourth embodiment, and other embodiments (not shown) in the disclosure may employ a manufacturing process similar to FIG. 8-FIG. 12A (or FIG. 12B) for manufacturing the conductive post.

The Second Embodiment

FIG. 13-FIG. 17 are schematic flow diagrams of a manufacturing method for forming a conductive post according to the second embodiment of the disclosure. Referring to FIG. 13-FIG. 17, the manufacturing method of a semiconductor structure 200a in the present embodiment is similar to that of the semiconductor structure 100a in FIG. 1-FIG. 12A (or 12B), and the differences therebetween are as follows. Referring FIG. 13, after the steps in FIG. 1-FIG. 6A are performed to form the through hole 112, a portion of the first dielectric layer 122 may be further removed so as to allow the second side wall portion 114b to extend into the first dielectric layer 122 and the conductor layer 121 to be exposed. In the present embodiment, the method for removing the portion of the first dielectric layer 122 is similar to the manufacturing process in FIG. 8.

Figure 14:
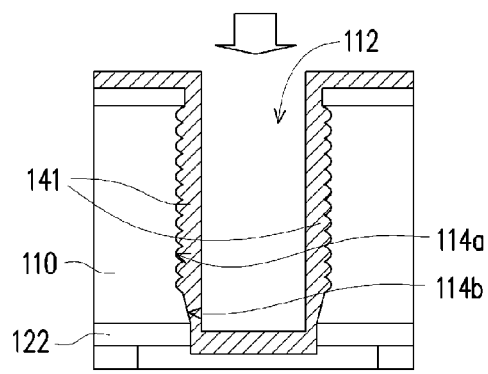
Figure 15:
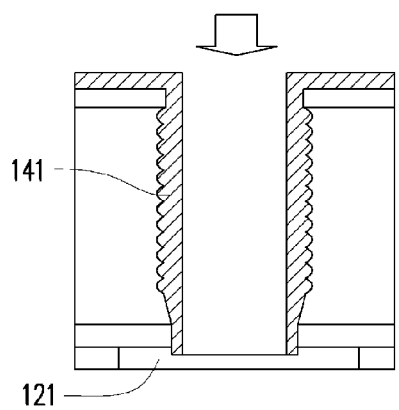
Figure 16:
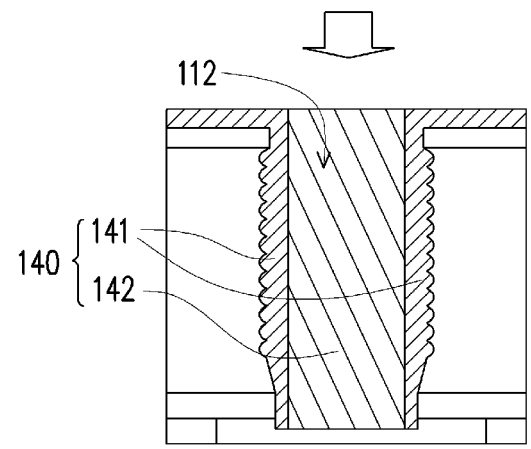

Next, referring to FIG. 14-FIG. 16, the liner layer 141 is first deposited on the first side wall portion 114a, the second side wall portion 114b, and the conductor layer 121 as illustrated in FIG. 14. The liner layer 141 disposed on top of the conductor layer 121 is then removed so as to expose the conductor layer 121 as illustrated in FIG. 15. Next, the through hole 112 is filled up by a conductive material to form the plug 142 as illustrated in FIG. 16. Accordingly, the liner layer 141 and the plug may form the conductive post 140. In the present embodiment, the methods for depositing the liner layer 141, removing the liner layer 141, and filling up the through hole 112 by the conductive material are similar to the manufacturing steps in FIG. 9-FIG. 11. The related detail is described in the previous paragraphs and may not be repeated herein.

Figure 17:
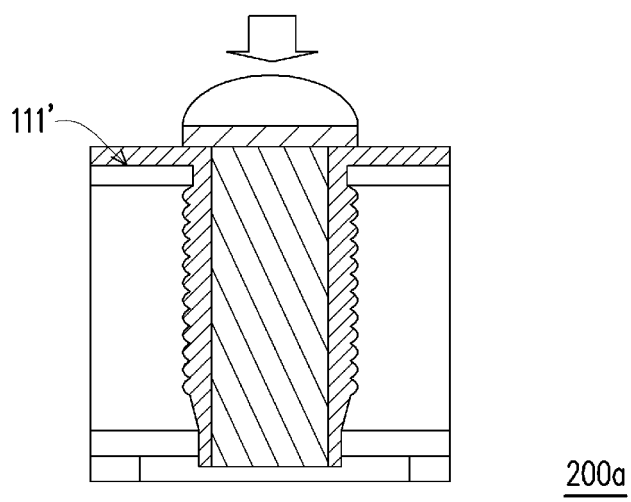

Next, referring to FIG. 17, the external terminal 150 (as illustrated in FIG. 17) or at least one of the redistribution layer 160 (not shown in FIG. 17) is formed on the first surface 111'. Accordingly, the semiconductor structure 200a of the present embodiment is formed. In the present embodiment, the method for forming the external terminal 150 or the at least one redistribution layer 160 is similar to the manufacturing steps in FIG. 12A and FIG. 12B. The related detail is described in the previous paragraphs and may not be repeated herein.

Similarly, since the difference between the semiconductor structure 200a and the semiconductor structure 100a is whether or not the liner layer 141 extends and is connected to the conductor layer 121, it does not affect the electrical connectivity between the conductive post 140 and the device layer 120 as well as the electrical insulation between the conductive post 140 and the substrate 110. Therefore, the manufacturing method for forming the semiconductor structure 200a may include the advantages of the aforementioned manufacturing method for forming the semiconductor structure 100a and may not be repeated herein.

The Third Embodiment

Figure 18:
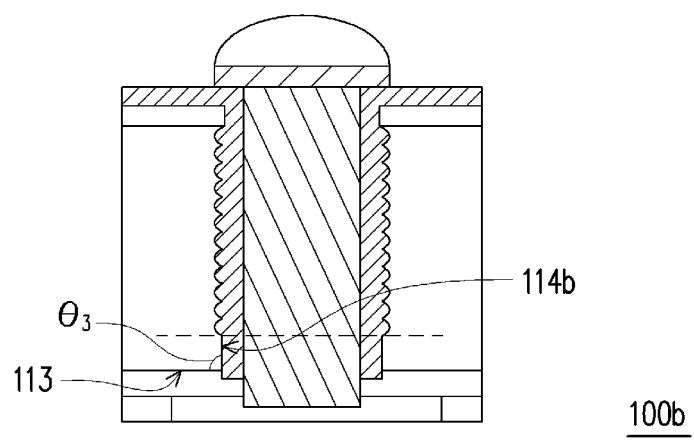
FIG. 18 is a cross-sectional diagram of another semiconductor structure of the disclosure.
Figure 19:
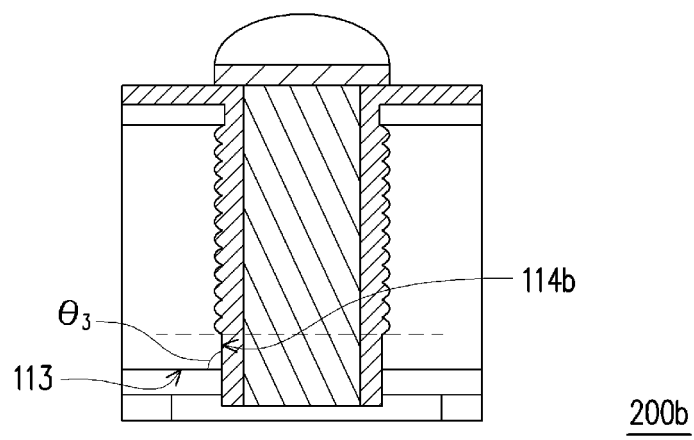
FIG. 19 is a cross-sectional diagram of another semiconductor structure of the disclosure.

FIG. 18 is a cross-sectional diagram of another semiconductor structure of the disclosure. FIG. 19 is a cross-sectional diagram of another semiconductor structure of the disclosure. As illustrated in FIG. 18 and FIG. 19, semiconductor structures 100b and 200b in FIG. 18 and FIG. 19 respectively are similar to the semiconductor structures 100a and 200a in FIG. 12A and FIG. 17. The main difference is that the included angle $\theta_3$ between the second side wall portion 114b and the second surface 113 is a right angle. Therefore, after the through hole 112 in FIG. 7A of the disclosure is formed as well as a conductive post is manufactured by employing the manufacturing process in FIG. 8-FIG. 12A or FIG. 13-FIG. 17, the semiconductor structures 100b and 200b are respectively formed. However, it should be noted that, besides the aforementioned method, the semiconductor structures 100b and 200b may be formed by employing the manufacturing process described hereafter. Further descriptions along with FIG. 20 are as follows.

Figure 20:
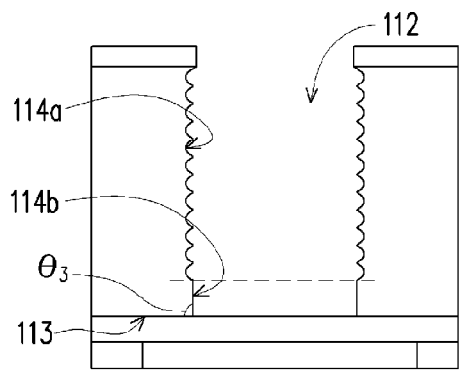
FIG. 20 is a schematic diagram of a manufacturing method for forming a through hole according to the third embodiment in the disclosure.

FIG. 20 is a schematic diagram of a manufacturing method for forming a through hole according to the third embodiment in the disclosure. The method for manufacturing the through hole 112 in the present embodiment is similar to that in FIG. 1-FIG. 7B, and the differences are as follows. Referring to FIG. 20, after the steps in FIG. 1-FIG. 5 are performed so as to form the first side wall portion 114a, the second side wall portion 114b is formed in the substrate 110 under the second etching condition. In the present embodiment, the aforementioned second etching condition is to form the second side wall portion 114b by the Bosch DRIE process. Therefore, the included angle $\theta_3$ between the second side wall portion 114b and the second surface 113 may be a right angle or slightly smaller than a right angle. Next, the manufacturing process of the conductive post may be performed by employing the manufacturing process in FIG. 8-FIG. 12A or FIG. 13-FIG. 17. Then, the semiconductor structures 100b and 200b are thus formed. The related detail of the remaining steps is described in the first embodiment and the second embodiment. The related detail may be referred to the previous paragraphs and may not be repeated herein.

Moreover, in the present embodiment, one skilled in the art may perform the manufacturing process in FIG. 12B based on an actual requirement for the circuit layout design of the semiconductor structures 100b and 200b. The related detail is described in the first embodiment. The related detail may be referred to the previous paragraphs and may not be repeated herein.

The Fourth Embodiment

Figure 21A:
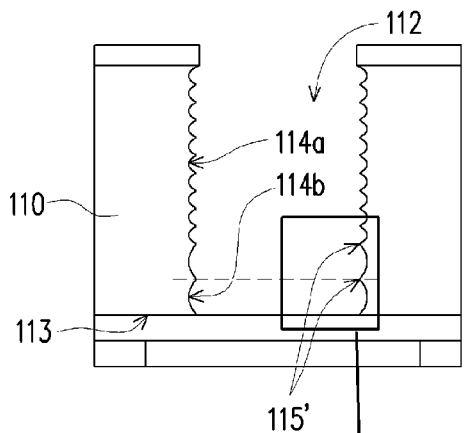
FIG. 21A is a schematic diagram of a manufacturing method for forming a through hole according to the fourth embodiment of the disclosure.
Figure 21B:
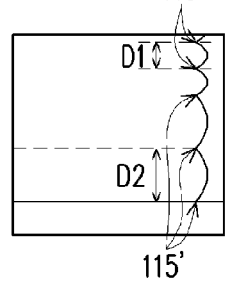
FIG. 21B is an enlarged partial diagram of a side wall of the through hole in FIG. 21A.

FIG. 21A is a schematic diagram of a manufacturing method for forming a through hole according to the fourth embodiment of the disclosure. FIG. 21B is an enlarged partial diagram of a side wall of the through hole in FIG. 21A. Referring to FIG. 21A, after the steps in FIG. 1-FIG. 5 are performed to form the first side wall portion 114a, the second side wall portion 114b is formed in the substrate 110 under the second etching condition. The first side wall portion 114a and the second side wall portion 114b may form the through hole 112 in the substrate 110. In the present embodiment, the method for forming the second etching condition includes adjusting the etching parameters of the first etching condition followed by forming the second side wall portion 114b by the Bosch DRIE method. Therefore, the second side wall portion 114b may include a plurality of second scallops 115', wherein the second scallops 115' may appear in regular patterns as well. Additionally, as illustrated in 21B, in the present embodiment, a dimension $D_1$ of the first scallops 115 may be less than a dimension $D_2$ of the second scallops by properly adjusting the etching parameters of the first etching condition.

Figure 22:
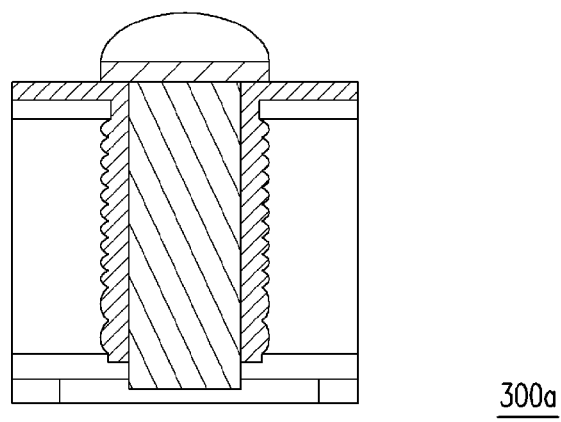
FIG. 22 is a cross-sectional diagram of a semiconductor structure according to the fourth embodiment of the disclosure.
Figure 23:
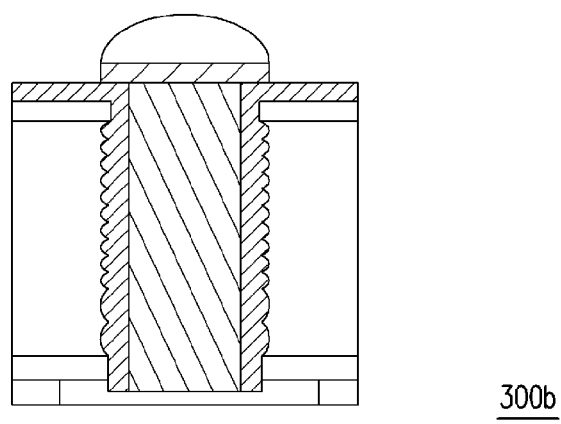
FIG. 23 is a cross-sectional diagram of another semiconductor structure according to the fourth embodiment of the disclosure.

FIG. 22 is a cross-sectional diagram of a semiconductor structure according to the fourth embodiment of the disclosure. FIG. 23 is a cross-sectional diagram of another semiconductor structure according to the fourth embodiment of the disclosure. Referring to FIG. 22 and FIG. 23, after the through hole 112 in FIG. 21A is formed, a conductive post may be manufactured by employing the manufacturing process in FIG. 8-FIG. 12A or FIG. 13-FIG. 17. Then, semiconductor structures 300a and 300b are thus formed respectively. The related detail of the steps is described in the first embodiment and the second embodiment. The related detail may be referred to the previous paragraphs and may not be repeated herein.

It should be noted that, besides an arc shape as illustrated in FIG. 21B, the shape of the second scallops 115' may be different due to a process recipe or a design requirement. The etching time may be controlled so as to form different outlines. Further descriptions along with FIG. 24A-FIG. 26 are as follows.

Figure 24A:
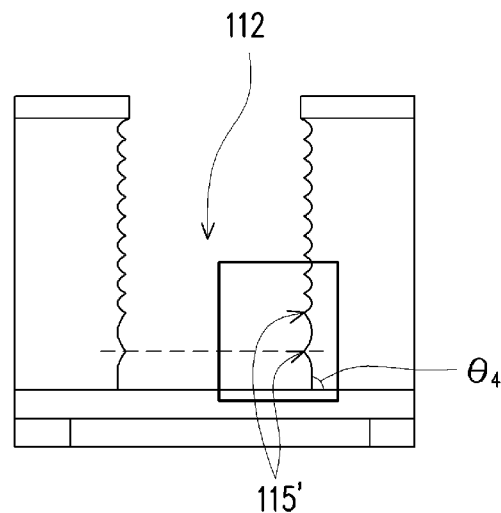
FIG. 24A is a cross-sectional diagram of another through hole according to the fourth embodiment of the disclosure.
Figure 24B:
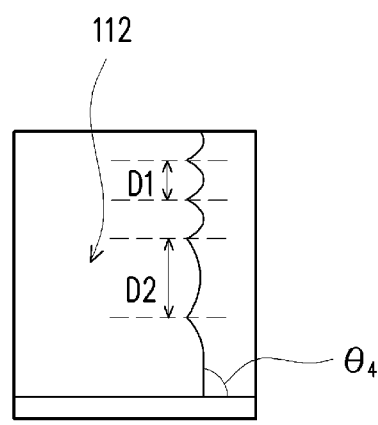
FIG. 24B is a partial enlarged diagram of a side wall of the through hole in FIG. 24A.

FIG. 24A is a cross-sectional diagram of another through hole according to the fourth embodiment of the disclosure. FIG. 24B is a partial enlarged diagram of a side wall of the through hole in FIG. 24A. Referring to FIG. 24A, the manufacturing step in FIG. 24A is similar to that in FIG. 7A and may change the outline of the bottom part of the through hole 112 by adjusting the etching time properly. Meanwhile, the side-etching effect may be more notable and an included angle $\theta_4$ may be larger accordingly (approximate to a right angle). Meanwhile, as illustrated in FIG. 24B, the included angle $\theta_4$ may be a right angle or slightly smaller than a right angle. The related detail may be referred to the related paragraphs and may not be repeated herein.

Figure 25:
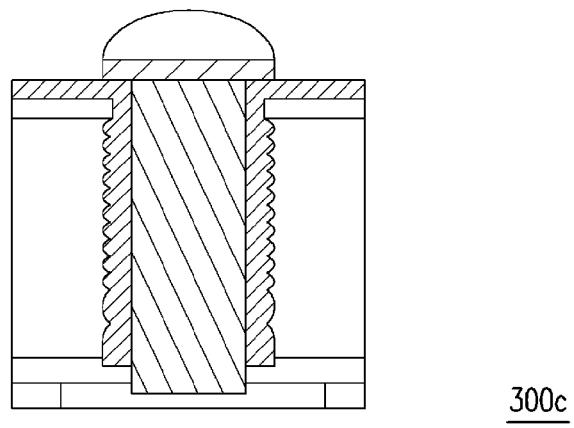
FIG. 25 is a cross-sectional diagram of another semiconductor structure according to the fourth embodiment of the disclosure.
Figure 26:
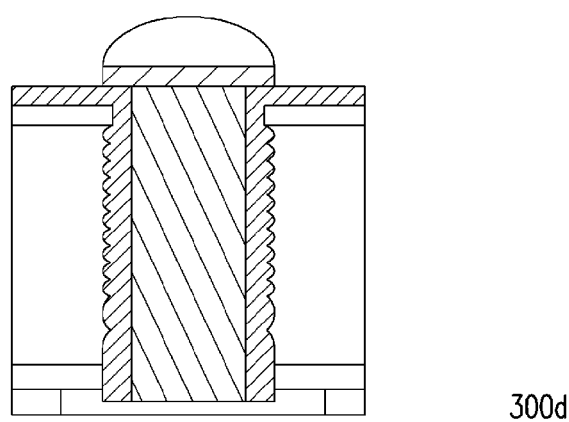
FIG. 26 is a cross-sectional diagram of another semiconductor structure according to the fourth embodiment of the disclosure.

FIG. 25 is a cross-sectional diagram of another semiconductor structure according to the fourth embodiment of the disclosure. FIG. 26 is a cross-sectional diagram of another semiconductor structure according to the fourth embodiment of the disclosure. After the through hole 112 in FIG. 24A is formed, a conductive post may be manufactured by employing the manufacturing process in FIG. 8-FIG. 12A or FIG. 13-FIG. 17 so as to form semiconductor structures 300c and 300d. The related detail of the related steps is described in the first embodiment and the second embodiment. The related detail may be referred to the previous paragraphs and may not be repeated herein.

Moreover, in the present embodiment, the one skilled in the art may perform the manufacturing process in FIG. 12B based on an actual requirement for the circuit layout design of the semiconductor structures 300a, 300b, 300c, and 300d. The related detail is described in the first embodiment. The related detail may be referred to the previous paragraphs and may not be repeated herein.

Since the difference among the semiconductors 300a, 300b, 300c, and 300d is the existence of the second scallops 115', which may not affect the technical features of the electrical connectivity between the conductive post 140 and the device layer 120 as well as the electrical insulation between the conductive post 140 and the substrate 110, the manufacturing methods for forming the semiconductor structures 300a, 300b, 300c, and 300d may include the advantages of the aforementioned manufacturing method for forming the semiconductor structure 100a and may not be repeated herein.

To sum up, in the disclosure, different etching conditions may be formed in different etching stages by adjusting etching parameters or changing an etching method. Therefore, a two-section structure may be formed on a side wall of a through hole. It may be advantageous for adjusting the depth of the through hole so as to prevent the formation of notches and may also be advantageous for a follow-up manufacturing process. An electrical leakage may be prevented, and the reliability as well as the manufacturing yield of a semiconductor structure may be enhanced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor structure comprising:
    a substrate, comprising a first surface, a second surface opposite to the first surface, and at least one through hole penetrating the substrate, at the through hole, the substrate comprising:
        a first side wall portion, connected to the first surface of the substrate and comprising a plurality of first scallops, the first scallops being regularly distributed on a surface of the first side wall portion; and
        a second side wall portion, connected to the second surface of the substrate and comprising a non-scalloped surface, wherein an included angle is formed between the non-scalloped surface and the second surface;
    a device layer, disposed on the second surface of the substrate, the second side wall portion of the substrate further extending into the device layer along the non-scalloped surface; and
    at least one conductive post, disposed in the through hole, wherein the conductive post and the device layer are electrically connected.

2. The semiconductor structure in claim 1, wherein the included angle is a right angle.

3. The semiconductor structure in claim 1, wherein the included angle is an acute angle between 30 degrees and 80 degrees.

4. The semiconductor structure in claim 1, wherein the device layer comprises:
    a conductor layer; and
    a first dielectric layer, disposed between the conductor layer and the substrate, wherein the second side wall portion is further extended into the first dielectric layer so as to expose the conductor layer.

5. The semiconductor structure in claim 1, wherein the conductive post comprises:
    a plug, disposed in the through hole; and
    a liner layer, disposed between the substrate and the plug, wherein the liner layer covers the first side wall portion and the second side wall portion so as to insulate the plug from the substrate.

6. The semiconductor structure in claim 1 further comprising at least one redistribution layer or an external terminal, wherein the redistribution layer or the external terminal are disposed on the first surface and electrically connected to the conductive post.

7. The semiconductor structure in claim 1 further comprising a second dielectric layer disposed on the first surface.

8. A semiconductor structure comprising:
    a substrate, comprising a first surface, a second surface opposite to the first surface, and at least one through hole penetrating the substrate, at the through hole, the substrate comprising:
        a first side wall portion, connected to the first surface of the substrate and comprising a plurality of first scallops, the first scallops being regularly distributed on a surface of the first side wall portion; and
        a second side wall portion, connected to the second surface of the substrate and comprising a plurality of second scallops, the second scallops being regularly distributed on a surface of the second side wall portion, and dimensions of the first scallops being less than dimensions of the second scallops;
    a device layer, disposed on the second surface of the substrate, the second side wall portion further extending into the device layer; and
    at least one conductive post, disposed in the through hole, the conductive post and the device layer being electrically connected.

9. The semiconductor structure in claim 8, wherein the device layer comprises:
    a conductor layer; and
    a first dielectric layer, disposed between the conductor layer and the substrate, the second side wall portion further extending into the first dielectric layer so as to expose the conductor layer.

10. The semiconductor structure in claim 8, wherein the conductive post comprises:
    a plug, disposed in the through hole; and
    a liner layer, disposed between the substrate and the plug, wherein the liner layer covers the first side wall portion and the second side wall portion so as to insulate the plug from the substrate.

11. The semiconductor structure in claim 8 further comprising at least one redistribution layer or an external terminal, wherein the redistribution layer or the external terminal is disposed on the first surface and electrically connected to the conductive post.

12. The semiconductive structure in claim 8 further comprising a second dielectric layer disposed on the first surface.

13. A manufacturing method of a semiconductor structure comprising:
    providing a substrate, wherein the substrate comprises a first surface and a second surface opposite to each other;

forming a device layer on the second surface of the substrate;

removing a portion of the substrate from the first surface so as to form at least one through hole in the substrate, wherein a method for forming the through hole comprises:

forming a first side wall portion in the substrate under a first etching condition, wherein the first side wall portion is connected to the first surface of the substrate, the first side wall portion comprises a plurality of first scallops, and the first side wall portion does not expose the device layer; and forming a second side wall portion in the substrate under a second etching condition, wherein the second side wall portion is connected to the second surface of the substrate, the first side wall portion and the second side wall portion form the through hole, the second side wall portion comprises a non-scalloped surface, and an included angle is formed between the non-scalloped surface and the second surface; and forming a conductive post in the through hole, wherein the conductive post and the device layer are electrically connected.

14. The manufacturing method of the semiconductor structure in claim 13 further comprising:
thinning the substrate before the through hole is formed in the substrate.

15. The manufacturing method of the semiconductor structure in claim 13, wherein the first etching condition is a Bosch Deep Reactive Ion Etching (Bosch DRIE) process, and the second etching condition is a non-Bosch DRIE process.

16. The manufacturing method of the semiconductor structure in claim 13, wherein the first etching condition is a Bosch DRIE process, and a method for forming the second etching condition comprises:
adjusting etching parameters of the first etching condition.

17. The manufacturing method of the semiconductor structure in claim 13, wherein the included angle is an acute angle between 30 degrees and 80 degrees.

18. The manufacturing method of the semiconductor structure in claim 13, wherein the included angle is a right angle.

19. The manufacturing method of the semiconductor structure in claim 13, wherein the device layer comprises a conductor layer and a first dielectric layer disposed between the conductor layer and the substrate, and a method for forming the conductive post comprises:

removing a portion of the first dielectric layer so as to allow the second side wall portion to extend into the first dielectric layer;

depositing a liner layer on the first side wall portion, the second side wall portion, and the first dielectric layer exposed by the through hole;

removing the liner layer disposed on top of the first dielectric layer and the first dielectric layer so as to expose the conductor layer; and filling up the through hole by a conductive material so as to form a plug, wherein the liner layer and the plug form the conductive post, and the liner layer covers the first side wall portion and the second side wall portion so as to insulate the plug from the substrate.

20. The manufacturing method of the semiconductor structure in claim 13, wherein the device layer comprises a conductor layer and a first dielectric layer disposed between the conductor layer and the substrate, and a method for forming the conductive post comprises:

removing a portion of the first dielectric layer so as to allow the second side wall portion to extend into the first dielectric layer and to expose the conductor layer;

deporting a liner layer on the first side wall portion, the second side wall portion, and the conductor layer;

removing the liner layer disposed on top of the conductor layer so as to expose the conductor layer; and filling up the through hole by a conductive material so as to form a plug, wherein the liner layer and the plug form the conductive post, and the liner layer covers the first side wall portion and the second side wall portion so as to insulate the plug from the substrate.

21. A manufacturing method of a semiconductor structure comprising:

providing a substrate, wherein the substrate comprises a first surface and a second surface opposite to each other;

forming a device layer on the second surface of the substrate;

removing a portion of the substrate from the first surface so as to form at least one through hole in the substrate, wherein a method for forming the through hole comprises:

forming a first side wall portion in the substrate under a first etching condition, wherein the first side wall portion is connected to the first surface of the substrate, the first side wall portion comprises a plurality of first scallops, and the first side wall portion does not expose the device layer; and forming a second side wall portion in the substrate under a second etching condition, wherein the second side wall portion is connected to the second surface of the substrate, the first side wall portion and the second side wall portion form the through hole, the second side wall portion comprises a plurality of second scallops, and dimensions of the first scallops are less than dimensions of the second scallops; and forming a conductive post in the through hole, wherein the conductive post and the device layer are electrically connected.

22. The manufacturing method of the semiconductor structure in claim 21 further comprising:
thinning the substrate before the through hole is formed in the substrate.

23. The manufacturing method of the semiconductor structure in claim 21, wherein the first etching condition is a Bosch DRIE process, and the method for forming the second etching condition comprises:
adjusting etching parameters of the first etching condition.

24. The manufacturing method of the semiconductor structure in claim 21, wherein the device layer comprises a conductor layer and a first dielectric layer disposed between the conductor layer and the substrate, and a method for forming the conductive post comprises:

removing a portion of the dielectric layer so as to allow the second side wall portion to further extend into the first dielectric layer;

depositing a liner layer on the first side wall portion, the second side wall portion, and the first dielectric layer exposed by the through hole;

removing the liner layer disposed on top of the first dielectric layer and the first dielectric layer so as to expose the conductor layer; and filling up the through hole by a conductive material so as to form a plug, wherein the liner layer and the plug form the conductive post, and the liner layer covers the first side wall portion and the second side wall portion so as to insulate the plug from the substrate.

25. The manufacturing method of the semiconductor structure in claim 21, wherein the device layer comprises a conductor layer and a first dielectric layer disposed between the conductor layer and the substrate, and a method for forming the conductive post comprises:
- removing a portion of the first dielectric layer so as to allow the second side wall portion to extend into the first dielectric layer and to expose the conductor layer;
- depositing a liner layer on the first side wall portion, the second side wall portion, and the conductor layer;
- removing the liner layer disposed on top of the conductor layer so as to expose the conductor layer; and
- filling up the through hole by a conductive material so as to form a plug, wherein the liner layer and the plug form the conductive post, and the liner layer covers the first side wall portion and the second side wall portion so as to insulate the plug from the substrate.

* * * * *